(12) United States Patent
Yang et al.

(10) Patent No.: US 12,366,008 B2
(45) Date of Patent: Jul. 22, 2025

(54) PROCESSED WAFER AND PROCESSING METHOD THEREOF

(71) Applicant: Fujian Jing'an Optoelectronics Co., Ltd., Quanzhou (CN)

(72) Inventors: Shengyu Yang, Quanzhou (CN); Minghui Fang, Quanzhou (CN); Lin Lu, Quanzhou (CN); Shihwei Huang, Quanzhou (CN); Shaobin Chen, Quanzhou (CN)

(73) Assignee: FUJIAN JING'AN OPTOELECTRONICS CO., LTD., Quanzhou (CN)

( * ) Notice: Subject to any disclaimer, the term of this patent is extended or adjusted under 35 U.S.C. 154(b) by 654 days.

(21) Appl. No.: 17/679,635

(22) Filed: Feb. 24, 2022

(65) Prior Publication Data

US 2022/0178049 A1    Jun. 9, 2022

Related U.S. Application Data

(63) Continuation-in-part of application No. PCT/CN2019/102602, filed on Aug. 26, 2019.

(51) Int. Cl.
C30B 29/30 (2006.01)
C30B 33/02 (2006.01)

(52) U.S. Cl.
CPC .............. *C30B 29/30* (2013.01); *C30B 33/02* (2013.01)

(58) Field of Classification Search
CPC ................................ C30B 29/30; C30B 33/02
See application file for complete search history.

(56) References Cited

U.S. PATENT DOCUMENTS

| | | | |
|---|---|---|---|
| 7,323,050 B2 | 1/2008 | Shiono | |
| 7,544,246 B2 | 6/2009 | Kajigaya et al. | |
| 7,544,247 B2 | 6/2009 | Kajigaya et al. | |
| 7,544,248 B2 | 6/2009 | Kajigaya et al. | |
| 7,628,853 B2 | 12/2009 | Kajigaya et al. | |
| 2004/0255842 A1 | 12/2004 | Kajigaya et al. | |
| 2006/0283375 A1 | 12/2006 | Kajigaya et al. | |
| 2010/0021373 A1* | 1/2010 | Kajigaya | C30B 29/30 423/594.8 |
| 2012/0068070 A1* | 3/2012 | Plotz | G01J 5/34 250/338.3 |

FOREIGN PATENT DOCUMENTS

| | | |
|---|---|---|
| CN | 1324167 C | 7/2007 |
| CN | 100348785 C | 11/2007 |
| CN | 100424235 C | 10/2008 |
| CN | 102369612 A | 3/2012 |
| CN | 102443851 A | 5/2012 |
| CN | 106048735 A | 10/2016 |
| CN | 106544735 A | 3/2017 |

OTHER PUBLICATIONS

Search Report issued to PCT application No. PCT/CN2019/102602 on May 28, 2020.

* cited by examiner

*Primary Examiner* — Yong L Chu
(74) *Attorney, Agent, or Firm* — MUNCY, GEISSLER, OLDS & LOWE, P.C.

(57) ABSTRACT

A processed wafer includes an outer surface, and a treated portion having a depth of 0 to 50 μm measured from the outer surface. At least a part of the treated portion has an oxygen concentration of less than 13 wt %. A method for processing a wafer includes the steps of: applying a reducing medium on the wafer, the reducing medium is in powder form and including a reducing agent, and at least one of a catalyst and a releasing agent; subjecting the wafer to a reduction reaction at a temperature below Curie temperature of the and under a non-oxidizing atmosphere so as to obtain the aforesaid processed wafer.

25 Claims, 2 Drawing Sheets

PROCESSED WAFER AND PROCESSING METHOD THEREOF

CROSS-REFERENCE TO RELATED APPLICATION

This application is a continuation-in-part application of PCT International Application No. PCT/CN2019/102602 filed on Aug. 26, 2019. The entire content of the international patent application is incorporated herein by reference.

FIELD

The present disclosure relates to a method for processing a wafer and a processed wafer obtained thereby.

BACKGROUND

Lithium tantalate ($LiTaO_3$) crystals and lithium niobate ($LiNbO_3$) crystals possess excellent piezoelectric, ferroelectric, acousto-optic, and electro-optic properties, and thus, are conventionally used in the fields of optical communication, laser, and optoelectronics. Furthermore, such crystals are widely used for manufacturing different types of surface acoustic wave (SAW) signal processing devices that function as oscillators, wave filters, transducers, etc. Due to their good electromechanical coupling, temperature coefficient, and other comprehensive properties, the aforesaid crystals are particularly utilized for manufacturing high-frequency SAW devices which are applicable in various high-end communication technologies, such as those for mobile phones, walkie-talkies, satellites, aircrafts, spacecrafts, etc. At present, considering high-frequency SAW devices satisfying 5G telecommunications technology standards, there are no other materials superior to lithium tantalate crystals.

In the manufacturing of SAW devices, lithium tantalate crystals is first subjected to several processing steps, such as cutting, grinding, polishing, etc., to obtain lithium tantalate wafers, and then metallic electrodes in comb-shaped arrangement (e.g., interdigital electrodes) are formed on the surface of the wafers via sputter deposition, photolithography, and/or other techniques. However, for SAW devices to be operated at a higher frequency, the metallic electrodes are required to be made thinner and finer, thus incurring the problems of reduced manufacturing yield and higher manufacturing cost, which are described below.

First, since the lithium tantalate crystals have a high pyroelectric coefficient ($23\times10^{-5}$ $C/(m^2 \cdot K)$) and an extremely high resistivity ($10^{13}$ $\Omega cm$ to $10^{15}$ $\Omega cm$), during manufacturing of a SAW device such as a wave filter, a change in temperature would cause a large amount of electrostatic charges to be easily accumulated on the surface of lithium tantalate wafers, and these electrostatic charges would be released among the metallic interdigital electrodes or the lithium tantalate wafers, therefore creating problems such as cracking of the lithium tantalate wafers or burning of metallic interdigital electrodes.

Second, lithium tantalate wafers have a high light transmittance, such that when the wave filter is subjected to a photolithography process during manufacturing thereof, a light transmitted through the lithium tantalate wafers would be reflected on a back surface thereof and then return to a front surface thereof, causing a decrease in the resolution of the thus formed pattern on the lithium tantalate wafers.

In order to resolve the aforesaid problems, the lithium tantalate wafers may be subjected to a reduction treatment to reduce the resistivity thereof. During such reduction treatment, the lithium tantalate wafers change from colorless or transparently pale yellow to opaquely colored (normally grey or brownish black). Thus, the reduction treatment is referred to as blackening. The opaquely colored lithium tantalate wafers have lowered light transmittance, such that the surface thereof to be patterned may have an improved pattern resolution.

CN 100424235 discloses a method for producing a lithium tantalate wafer, in which a crystal or metallic substrate containing lithium tantalate, lithium niobate or hydrogen storage metals is first subjected to a first reduction treatment that is performed in a reducing atmosphere of a circulating gas or an inert gas so as to obtain a reduced crystal or metallic substrate, which is then stacked on a lithium tantalate wafer to be further subjected to a second reduction treatment at a temperature lower than that of the first reduction treatment. The method of CN 100424235 involves complex steps, i.e., subjecting the crystal or metallic substrate (which might be costly) to the first reduction treatment under a Curie temperature or higher, grinding the lithium tantalate wafer to confer a high degree of flatness for ensuring its close contact with the reduced crystal or metallic substrate, and conducting the second reduction treatment under a reducing atmosphere. Thus, the method of CN 100424235 requires a long time period with a high manufacturing cost. Moreover, the blackening degree of the lithium tantalate wafer is uneven, which adversely affects precision of a subsequent exposing procedure.

CN 1324167 discloses a process for manufacturing a lithium tantalate substrate, wherein an ingot form of a lithium tantalate crystal, which is embedded in carbon or silicon powders, or which is placed in a carbon or silicon vessel, is mixed powder of aluminum and aluminum oxide, followed by subjecting the lithium tantalate crystal to a reduction treatment that is performed in a reduced-pressure atmosphere of a gas such as nitrogen, argon, etc., so as to obtain a reduced lithium tantalate substrate that is colored and opaque. However, it remains difficult to accurately adjust the ratio of aluminum and aluminum oxide and to control the uniformity of the resultant mixed powder, and thus, the color of the lithium tantalate crystal is uneven.

SUMMARY

Therefore, an object of the disclosure is to provide a method for processing a wafer and a processed wafer made therefrom that can alleviate at least one of the drawbacks of the prior art.

According to a first aspect of the disclosure, a processed wafer includes an outer surface, and a treated portion having a depth of 0 to 50 μm measured from the outer surface. At least a part of the treated portion has an oxygen concentration of less than 13 wt %.

According to a second aspect of the disclosure, a method for processing a wafer includes the following steps: (a) applying a reducing medium on at least one wafer, the reducing medium being in powder form and including a reducing agent, and at least one of a catalyst and a releasing agent, the catalyst generating a reducing gas upon heating; and (b) subjecting the wafer applied with the reducing medium to a reduction reaction at a temperature below Curie temperature of a material of the wafer and under a non-oxidizing atmosphere so as to obtain a processed wafer.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
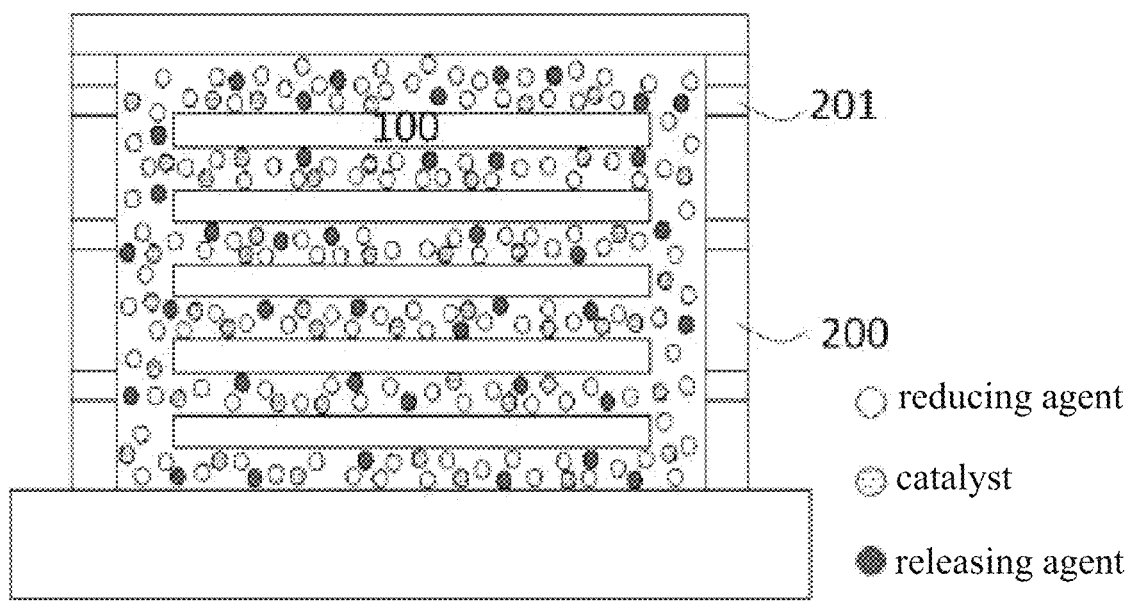
FIG. 1 is a schematic view illustrating an embodiment of a method for processing a wafer according to the present disclosure.

Before the present disclosure is described in greater detail, it should be noted that where considered appropriate, reference numerals or terminal portions of reference numerals have been repeated among the figures to indicate corresponding or analogous elements, which may optionally have similar characteristics.

The present disclosure provides a method for processing a wafer 100, which includes the steps of:

(a) applying a reducing medium on at least one wafer 100, the reducing medium being in powder form and including a reducing agent, and at least one of a catalyst and a releasing agent, the catalyst generating a reducing gas upon heating; and (b) subjecting the wafer 100 applied with the reducing medium to a reduction reaction at a temperature below Curie temperature (for example, 603° C.) of a material of the wafer and under a non-oxidizing atmosphere so as to obtain a processed wafer 100.

The wafer 100 of the present disclosure may be made of lithium tantalate, lithium niobate, or a combination thereof. In certain embodiments of this disclosure, the wafer 100 is a lithium tantalate wafer or a lithium niobate wafer.

The lithium tantalate wafer 100 is used as an example for illustration of the embodiments.

Figure 2:
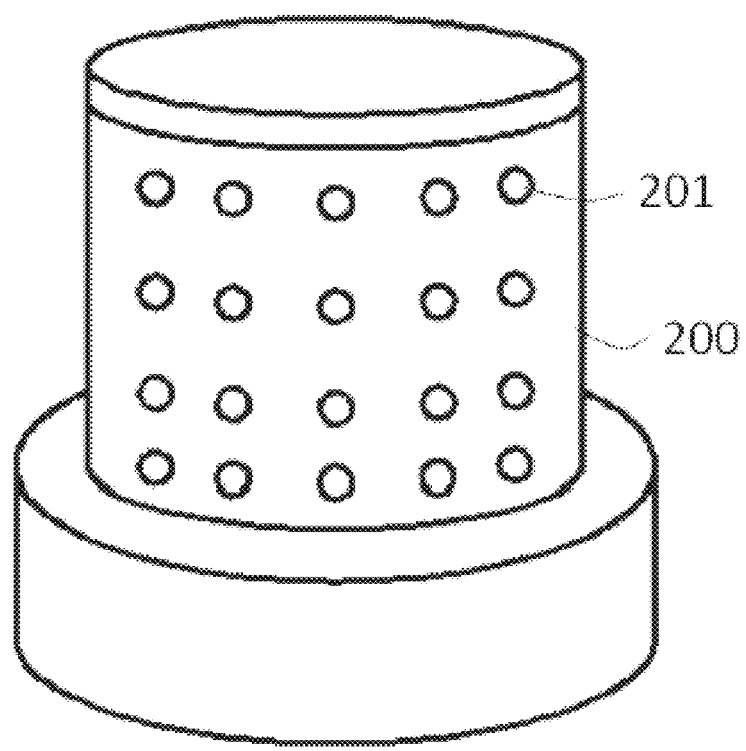
FIG. 2 is a perspective view illustrating an embodiment of a cylindrical housing utilized in the method for processing a wafer according to the present disclosure.

The method is conducted in a cylindrical housing which has a side wall 200 formed with a porous structure 201 (see FIGS. 1 and 2). The cylindrical housing may be a quartz container.

As shown in FIG. 1, a plurality of lithium tantalate wafers 100 are disposed in the cylindrical housing, and the reducing medium is applied between the lithium tantalate wafers 100.

During the reduction reaction, the lithium tantalate wafer(s) 100 changes from white or yellow to brown or black so as to reduce light transmittance.

The reduction reaction is performed at a temperature ranging from 350° C. to 560° C. In some embodiments, the temperature ranges from 350° C. to 450° C. In other embodiments, the temperature ranges from 450° C. to 560° C. If the temperature is greater than 450° C., the sintered reducing medium may be remained on the surface of the lithium tantalatewafer(s) 100, which would complicate the subsequent procedures. If the temperature is less than 450° C., desired blackening effect would not be achieved. Furthermore, if the temperature is greater than 560° C., which is close to Curie temperature of the lithium tantalate, a part of the lithium tantalate wafer(s) 100 may be depolarized, causing loss of the piezoelectric property.

The non-oxidizing atmosphere may include one of hydrogen, nitrogen, and a combination thereof.

The particle size of the reducing agent may range from 10 µm to 100 µm. In certain embodiments, the reducing agent may include a carbonate salt. During the reduction reaction, the carbonate salt may be decomposed to release carbon dioxide, and the carbon dioxide may react with the reducing gas to form carbon monoxide. The carbon monoxide would react with pentavalent tantalum of the lithium tantalate wafer(s) 100 to generate tetravalent tantalum and carbon dioxide. An example of the carbonate salt includes lithium carbonate. It should be noted that, the non-oxidizing atmosphere is preferably free of carbon monoxide to avoid adverse effect on the reduction reaction.

Metal with a relatively high activity, e.g., iron, zinc, aluminum, copper, or cesium, may also be used as the reducing agent. Moreover, the particle size of the reducing agent ranges from 10 µm to 100 µm.

In certain embodiments, the catalyst may include an organic substance having a —COO— functional group (e.g. carboxyl group (—COOH)) that can generate carbon monoxide upon heating. In certain embodiments, the catalyst includes unsaturated polyester resin, acrylate, and the combination thereof. Examples of the acrylate include polyester acrylate, epoxy acrylate resin, polyurethane acrylate resin, and combinations thereof. In certain embodiments, the polyester resin or acrylate having a high activity is used as the catalyst, and the amount of the catalyst may be relatively small, e.g., ranging from 3 wt % to 5 wt %.

The releasing agent can facilitate the separation of the reducing medium from the processed lithium tantalate wafer(s) 100. Due to the reducing agent and the catalyst being sintered and forming a sintered substance under a high temperature, such sintered substance may remain on the surface of the processed lithium tantalate wafer(s) 100 after the reduction reaction, and may be difficult to be removed, which increases the risk of damage to the lithium tantalate wafer(s) 100. With the releasing agent, the sintered substance can be easily removed from the processed lithium tantalate wafer(s) 100. In this disclosure, the releasing agent may include a non-metal oxide powder. In certain embodiments, the non-metal oxide powder has a high melting point, i.e., greater than 400° C. (e.g., greater than 1000° C.), permitting the catalyst to maintain the gas permeability of the reducing medium after the high temperature reaction. Since the non-metal oxide powder has a high melting point, no reduction reaction is involved and sintering procedure would not be occurred, thereby ensuring stability of the reaction. In some embodiments, the releasing agent may include one of silicon dioxide powder, silicon carbide powder, and silicon powder. Moreover, the particle size of the releasing agent ranges from 10 µm to 100 µm. It should be noted that, the particle size of the releasing agent may not affect the releasing effect of the reducing medium, but mainly affects the gas permeability of the reducing medium. In certain embodiments, the difference between a particle size of the reducing agent and a particle size of the releasing agent is not greater than 10% of the particle size of the reducing agent, so as to prevent the releasing agent from interfering with the contact between the reducing agent and the lithium tantalate wafer(s) 100.

In certain embodiments, the reducing medium includes the reducing agent, the catalyst and the releasing agent. In certain embodiments, based on a total weight of the reducing medium, the reducing agent is present in an amount ranging from 50 wt % to 95 wt %, the catalyst is present in an amount ranging from 3 wt % to 45 wt %, and the releasing agent is present in an amount ranging from 2 wt % to 5 wt %. In other embodiments, based on a total weight of the reducing medium, the reducing agent is present in an amount ranging from 85 wt % to 95 wt %, the catalyst is present in an amount ranging from 3 wt % to 10 wt o, and the releasing agent is present in an amount ranging from 2 wt % to 5 wt %.

The present disclosure also provides a processed lithium tantalate wafer 100 obtained by the abovementioned method.

According to the present disclosure, the processed lithium tantalate wafer 100 includes an outer surface, and a treated portion having a depth of 0 to 50 µm measured from the outer surface. At least a part of the treated portion may have an oxygen concentration of less than 13 wt %. In certain embodiments, the at least a part of the treated portion may have the oxygen concentration of less than 12.5 wt %. In certain embodiments, 80% to 95% or greater than 95% of the treated portion may have the oxygen concentration of not more than 12.5 wt %. In certain embodiments, 80% to 95% or greater than 95% of the treated portion may have the oxygen concentration ranging from 11.5 wt % to 12.5 wt %. In this disclosure, the processed lithium tantalate wafer 100 having an oxygen concentration of less than 13 wt % may have a low transmittance and a high conductivity. By reducing the oxygen concentration, the treated portion may have a relatively high oxygen vacancy concentration, which increases the space for electron movement. Thus, the electrical resistance is reduced, and the conductivity of the processed lithium tantalate wafer 100 is increased. Since the pentavalent tantalate is a relatively stable material, reducing the oxygen concentration to create a hypoxic state can increase the activity of the pentavalent tantalate. Thus, the pentavalent tantalum can be transformed into tetravalent tantalum by performing the reduction reaction under the hypoxic state. The lithium tantalate wafer 100 may be converted from white/yellow to brown/black.

It should be noted that, the blackening degree may be different between the outer surface and inner surface of the processed lithium tantalate wafer 100. Thus, the thicker the treated portion to be polished, the lighter the color of the processed lithium tantalate wafer(s) 100 is.

The processed lithium tantalate wafer 100 may have a transmittance of less than 1% (or 0%) at a wavelength ranging from 350 nm to 450 nm. The light having a wavelength ranging from 350 to 450 nm (e.g., I line and G line) is commonly utilized in photolithography process. Specifically, the transmittance of 0% means that the light cannot transmit through the processed lithium tantalate wafer 100.

The processed lithium tantalate wafer 100 is subjected to color determination for analyzing the reduction (blackening) degree. Specifically, the L value (i.e., degree of lightness from black (0) to white (100)) of the processed lithium tantalate wafer 100 is measured using a spectrophotometer according to procedures of CIELAB color space. In certain embodiments, the processed lithium tantalate wafer(s) 100 may have a lightness (L value) of less than 60 in CIELAB color space.

Furthermore, the processed lithium tantalate wafer 100 may have a resistance ranging from $1 \times 10^9$ Ωcm to $9 \times 10^{11}$ Ωcm. In certain embodiments, the resistance of the processed lithium tantalate wafer 100 is less than $9 \times 10^{10}$ Ωcm.

The disclosure will be further described by way of the following embodiments. However, it should be understood that the following embodiments are solely intended for the purpose of illustration and should not be construed as limiting the disclosure in practice.

First Embodiment:

In the first embodiment, the lithium tantalate wafers 100 applied with the reducing medium therebetween are disposed in a quartz container, and then subjected to the reduction reaction at the temperature ranging from 350° C. to 450° C. under a non-oxidizing atmosphere having a flow rate that ranges from 1 L/min to 3 L/min for 2 to 4 hours, followed by cooling to a room temperature. The processed lithium tantalate wafers 100 thus obtained have a resistance ranging from $1 \times 10^{10}$ Ωcm to $9 \times 10^{11}$ Ωcm, and a color of brownish black.

In this embodiment, each of the processed lithium tantalate wafers 100 is analyzed using energy dispersive spectroscopy (EDS). It is found that each of the processed lithium tantalate wafers 100 has a treated portion which had been subjected to the reduction reaction. At least a portion of the treated portion (e.g., an outer surface of the processed lithium tantalate wafers 100) has an oxygen concentration ranging from 12 wt % to 13 wt %.

In this embodiment, the L value is about 60 when the oxygen concentration is 13 wt %, and is about 50 when the oxygen concentration is 12 wt %. As mentioned in the foregoing, the L value may decrease as the oxygen concentration decreases.

In this embodiment, the processed lithium tantalate wafers 100 have a transmittance which is less than 1% at a wavelength ranging from 350 nm to 450 nm, and which is measured by UV-Visible/NIR Spectrophotometer UH4150 (purchased from Hitachi High-Tech Science Corporation).

The reducing medium used in this embodiment includes a reducing agent and a catalyst. The reducing agent is present in an amount ranging from 55 wt % to 97 wt %, and the catalyst is present in an amount ranging from 3 wt % to 45 wt %. The reducing medium is evenly mixed before use. Moreover, as the proportion of the catalyst increases, the reducing medium can be condensed more effectively. The reducing agent used in this embodiment includes lithium carbonate ($Li_2CO_3$) having a particle size ranging from 10 µm to 100 µm. The smaller the particle diameter is, the better the blackening effect is. It should be noted that, the reducing agent can be used repeatedly.

The catalyst used in this embodiment is an organic substance having —COO— functional group, and includes acrylate.

Second Embodiment

In the second embodiment, the method for processing the lithium tantalate wafers 100 is generally similar to that of the first embodiment, except for the following differences.

In this embodiment, the reducing medium further includes a releasing agent, in addition to the reducing agent and the catalyst. Furthermore, based on a total weight of the reducing medium, the reducing agent is present in an amount ranging from wt % to 95 wt %, the catalyst is present in an amount ranging from 3 wt % to 45 wt %, and the releasing agent is present in an amount ranging from 2 wt % to 5 wt %.

The releasing agent used in this embodiment includes silicon dioxide powder.

It should be noted that, when the reaction temperature of the reduction reaction is less than 450° C., the releasing agent may cause the reducing agent not to be sintered, so that the reducing medium can be easily removed from the processed lithium tantalate wafers 100. When the reaction temperature is greater than 450° C. and the reducing agent is likely to be sintered, the releasing agent may give rise to the reducing agent being in a loosen state, which facilitates removal of the reducing medium from the processed lithium tantalate wafers 100.

In this embodiment, the processed lithium tantalate wafers 100 have the same properties as those of the first embodiment.

Third Embodiment

In the third embodiment, the method for processing the lithium tantalate wafers 100 is generally similar to that of the second embodiment, except for the following differences.

In this embodiment, the temperature of the reduction reaction is 450° C. to 560° C. Furthermore, based on a total weight of the reducing medium, the reducing agent is present in an amount ranging from 85 wt % to 95 wt %, the catalyst is present in an amount ranging from 3 wt % to 10 wt %, and the releasing agent is present in an amount ranging from 2 wt % to 5 wt %.

If the reducing medium has a high percentage of the catalyst, the reducing medium may become pasty, and may be difficult to be applied on both sides of the lithium tantalate wafers 100. The reducing medium that has been applied on one side of each of the lithium tantalate wafers 100 may flow and then deformed due to gravity during application of the reducing medium on the other side of each of the lithium tantalate wafers 100. In such condition, before the reduction reaction, the reducing medium is preferably subjected to a baking procedure. However, such baking procedure may render the reducing medium shrunk and cracked, causing a part of the reducing medium not to be in contact with the lithium tantalate wafers 100. Thus, the blackening degree is non-uniform, and the processed lithium tantalate wafers 100 may have cracking trace on the surfaces thereof due to the shrinkage and cracking of the reducing medium. Moreover, the catalyst may be volatilized during the reduction reaction, causing partial contact to occur between the reducing medium and the lithium tantalate wafers 100. Thus, the blackening degree of the processed lithium tantalate wafers 100 is uneven, which causes color difference on the processed lithium tantalate wafers 100.

In this embodiment, the catalyst is reduced to an amount ranging from 3 wt % to 10 wt %.

In this embodiment, the processed lithium tantalate wafers 100 have the same properties as those of the first and second embodiment.

Fourth Embodiment

The fourth embodiment of the processing method of the lithium tantalate wafer(s) 100 and the performance of the processed lithium tantalate wafer(s) 100 obtained thereby of the present disclosure is generally similar to the third embodiment, except for the following differences.

In this embodiment, the reduction reaction is conducted in a cylindrical housing having a side wall which is formed with a plurality of through holes (as shown in FIGS. 1 and 2). Since the lithium tantalate wafer(s) 100 is circular in this embodiment, use of the cylindrical housing may ensure that the reducing medium is to be evenly applied on an edge of the lithium tantalate wafer 100 and may save the amount of the reducing medium, and the reducing medium can be conveniently applied on the lithium tantalate wafers 100. Moreover, since the cylindrical housing has the heating function for heating the wafer(s) 100, the cylindrical shape may ensure that the lithium tantalate wafer(s) 100 applied with reducing medium can be heated more uniformly.

In this embodiment, the reduction reaction is performed at a temperature ranging from 350° C. to 450° C. under a non-oxidizing atmosphere having a flow rate ranging from 1 L/min to 2 L/min for 0.5 to 1 hours. During the reduction treatment, the reducing gas would enter into of the cylindrical housing through the through holes formed on the side wall 200 thereof to allow the reduction reaction to be performed, and then the reaction gas product and carbon dioxide would be exhausted through the through holes.

In this embodiment, the processed lithium tantalate wafers 100 have the oxygen concentration of 11.5 wt % to 12.5 wt % on the surface thereof, an L value which is about 43 when the oxygen concentration is 11.5 wt %, a transmittance of 0% at a wavelength ranging from 350 nm to 450 nm, and a resistance ranging from $1 \times 10^9$ Ωcm to $9 \times 10^{10}$ Ωcm.

In summary, by treating the lithium tantalate wafer(s) 100 with the reducing medium that includes the reducing agent, and at least one of the catalyst and the releasing agent, the processed wafer 100 may have a low transmittance rate, a low resistivity, less pyroelectric effect, an increased electrical conductivity, and a uniform degree of lightness. Moreover, the processed wafer 100 may not have the phenomenon of surface charge accumulation, and the piezoelectricity thereof may not be adversely affected after the reduction reaction. Furthermore, the method of the present disclosure can be performed at a relatively low temperature, and is cost-effective and time-saving. Thus, when the processed wafers 100 of the present disclosure is utilized for manufacturing surface acoustic wave (SAW) devices, the yield of such devices can be greatly improved.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A processed wafer, comprising:
   an outer surface; and
   a treated portion having a depth that is no greater than 50 µm measured from the outer surface,
   wherein at least a part of said treated portion has an oxygen concentration of less than 13 wt %; and
   wherein said processed wafer has a transmittance of less than 1% at a wavelength ranging from 350 nm to 450 nm.

2. The processed wafer as claimed in claim 1, wherein said at least a part of said treated portion has the oxygen concentration of less than 12.5 wt %.

3. The processed wafer as claimed in claim 1, wherein 80% to 95% of said treated portion has the oxygen concentration of less than 12.5 wt %.

4. The processed wafer as claimed in claim 1, wherein greater than 95% of said treated portion has the oxygen concentration of less than 12.5 wt %.

5. The processed wafer as claimed in claim 1, wherein 80% to 95% of said treated portion has the oxygen concentration ranging from 11.5 wt % to 12.5 wt %.

6. The processed wafer as claimed in claim 1, wherein greater than 95% of said treated portion has the oxygen concentration ranging from 11.5 wt % to 12.5 wt %.

7. The processed wafer as claimed in claim 1, which has a transmittance rate of 0% at a wavelength ranging from 350 nm to 450 nm.

8. The processed wafer as claimed in claim 1, which has a lightness (L value) of less than 60 in color space.

9. The processed wafer as claimed in claim 1, which has a resistance of less than $9 \times 10^{10}$ Ωcm.

10. The processed wafer as claimed in claim 1, which is made of one of lithium tantalate, lithium niobate, and a combination thereof.

11. A method for processing a wafer of claim 1, comprising the steps of:
(a) applying a reducing medium on at least one wafer, the reducing medium being in powder form and including a reducing agent, and at least one of a catalyst and a releasing agent, the catalyst generating a reducing gas upon heating; and
(b) subjecting the wafer applied with the reducing medium to a reduction reaction at a temperature below Curie temperature of a material of the wafer and under a non-oxidizing atmosphere so as to obtain a processed wafer.

12. The method as claimed in claim 10, wherein, in step (a), the reducing medium is applied between two of the wafers.

13. The method as claimed in claim 10, wherein the reducing agent includes a carbonate salt.

14. The method as claimed in claim 10, wherein the catalyst includes an organic substance having a —COO— functional group.

15. The method as claimed in claim 10, wherein the catalyst includes one of unsaturated polyester resin and acrylate.

16. The method as claimed in claim 10, wherein the releasing agent includes a non-metal oxide powder.

17. The method as claimed in claim 10, wherein
the reducing medium includes the reducing agent, the catalyst and the releasing agent, and
based on a total weight of the reducing medium, the reducing agent is present in an amount ranging from 50 wt % to 95 wt %, the catalyst is present in an amount ranging from 3 wt % to 45 wt %, and the releasing agent is present in an amount ranging from 2 wt % to 5 wt %.

18. The method as claimed in claim 16, wherein based on the total weight of the reducing medium, the reducing agent is present in an amount ranging from 85 wt % to 95 wt %, the catalyst is present in an amount ranging from 3 wt % to 10 wt %, and the releasing agent is present in an amount ranging from 2 wt % to 5 wt %.

19. The method as claimed in claim 10, wherein the difference between a particle size of the reducing agent and a particle size of the releasing agent is not greater than 10% of the particle size of the reducing agent.

20. The method as claimed in claim 10, wherein step (b) is conducted at a temperature ranging from 350° C. to 560° C.

21. The method as claimed in claim 10, wherein step (b) is conducted in a cylindrical housing having a side wall formed with a porous structure.

22. The method as claimed in claim 10, wherein the non-oxidizing atmosphere includes one of hydrogen, nitrogen, and a combination thereof.

23. The method as claimed in claim 10, wherein the processed wafer has a transmittance rate of 0% at a wavelength ranging from 350 nm to 450 nm.

24. The method as claimed in claim 10, wherein the releasing agent includes one of silicon dioxide powder, silicon carbide powder, and silicon powder.

25. The method as claimed in claim 10, wherein the wafer is made of one of lithium tantalate, lithium niobate, and a combination thereof.

* * * * *